(12) United States Patent
Den Boef et al.

(10) Patent No.: US 7,564,555 B2
(45) Date of Patent: Jul. 21, 2009

(54) METHOD AND APPARATUS FOR ANGULAR-RESOLVED SPECTROSCOPIC LITHOGRAPHY CHARACTERIZATION

(75) Inventors: Arie Jeffrey Den Boef, Waalre (NL); Mircea Dusa, Campbell, CA (US); Everhardus Cornelis Mos, Best (NL); Maurits Van Der Schaar, Eindhoven (NL); Stefan Carolus Jacobus Antonius Keij, Breda (NL)

(73) Assignee: ASML Netherlands B.V., Veldhoven (NL)

( * ) Notice: Subject to any disclaimer, the term of this patent is extended or adjusted under 35 U.S.C. 154(b) by 353 days.

(21) Appl. No.: 11/504,106

(22) Filed: Aug. 15, 2006

(65) Prior Publication Data
US 2008/0043239 A1 Feb. 21, 2008

(51) Int. Cl.
*G01B 11/00* (2006.01)
(52) U.S. Cl. ...................................... 356/401; 356/445
(58) Field of Classification Search ......... 356/399–401, 356/620
See application file for complete search history.

(56) References Cited

U.S. PATENT DOCUMENTS

| | | | |
|---|---|---|---|
| 5,703,692 A | 12/1997 | McNeil et al. | 356/445 |
| 5,880,838 A | 3/1999 | Marx et al. | 356/351 |
| 5,963,329 A | 10/1999 | Conrad et al. | 356/372 |
| 6,608,690 B2 | 8/2003 | Niu et al. | 356/635 |
| 6,699,624 B2 | 3/2004 | Niu et al. | 430/5 |
| 6,704,661 B1 | 3/2004 | Opsal et al. | 702/27 |
| 6,721,691 B2 | 4/2004 | Bao et al. | 702/189 |
| 6,738,138 B2 | 5/2004 | Wei | 356/369 |
| 6,753,961 B1 | 6/2004 | Norton et al. | 356/364 |
| 6,768,983 B1 | 7/2004 | Jakatdar et al. | 706/46 |
| 6,772,084 B2 | 8/2004 | Bischoff et al. | 702/127 |
| 6,785,638 B2 | 8/2004 | Niu et al. | 702/189 |
| 6,813,034 B2 | 11/2004 | Rosencwaig et al. | 356/601 |
| 6,819,426 B2 | 11/2004 | Sezginer et al. | 356/401 |
| 6,856,408 B2 | 2/2005 | Raymond | 356/601 |
| 6,919,964 B2 | 7/2005 | Chu | 356/601 |
| 6,928,628 B2 | 8/2005 | Seligson et al. | 716/4 |
| 6,972,852 B2 | 12/2005 | Opsal et al. | 356/625 |
| 6,974,962 B2 | 12/2005 | Brill et al. | 250/548 |
| 6,987,572 B2 | 1/2006 | Lakkapragada et al. | 356/601 |

(Continued)

FOREIGN PATENT DOCUMENTS

EP 1 628 164 A2 2/2006

(Continued)

*Primary Examiner*—L. G Lauchman
(74) *Attorney, Agent, or Firm*—Sterne, Kessler, Goldstein & Fox P.L.L.C.

(57) ABSTRACT

An inspection system is arranged to measure an overlay error by projecting a plurality of radiation beams, differing in wavelength and/or polarization, onto two targets. A first radiation beam is projected onto a first target and the reflected radiation $A_{1+}$ is detected. The first target comprises two gratings having a bias +d with respect to each other. The first radiation beam is also projected on to a second target, which comprises two gratings having a bias −d with respect to each other, and the reflected radiation $A_{1-}$ is detected. A second radiation beam, having a different wavelength and/or polarization from the first radiation beam, is projected onto the first target and reflected radiation $A_{2+}$ is detected and projected onto the second target and reflected radiation $A_{2-}$ is detected. Detected radiations $A_{1+}$, $A_{1-}$, $A_{2+}$, and $A_{2-}$ is used to determine the overlay error.

19 Claims, 5 Drawing Sheets

U.S. PATENT DOCUMENTS

| | | | |
|---|---|---|---|
| 7,042,569 B2 * | 5/2006 | Sezginer et al. | 356/401 |
| 7,046,376 B2 | 5/2006 | Sezginer | 356/601 |
| 7,061,615 B1 | 6/2006 | Lowe-Webb | 356/401 |
| 7,061,623 B2 | 6/2006 | Davidson | 356/497 |
| 7,061,627 B2 | 6/2006 | Opsal et al. | 356/601 |
| 7,068,363 B2 | 6/2006 | Bevis et al. | 356/237.5 |
| 7,112,813 B2 * | 9/2006 | Den Boef et al. | 250/559.3 |
| 7,230,703 B2 * | 6/2007 | Sezginer et al. | 356/401 |
| 7,230,705 B1 * | 6/2007 | Yang et al. | 356/401 |
| 7,283,237 B2 * | 10/2007 | Sezginer et al. | 356/401 |
| 7,301,634 B2 * | 11/2007 | Mieher et al. | 356/401 |
| 7,317,531 B2 * | 1/2008 | Mieher et al. | 356/401 |
| 2004/0119970 A1 | 6/2004 | Dusa et al. | 356/237.1 |
| 2006/0033921 A1 | 2/2006 | Den Boef et al. | 356/446 |
| 2006/0066855 A1 | 3/2006 | Den Boef et al. | 356/401 |
| 2006/0126074 A1 | 6/2006 | Van Der Werf et al. | 356/489 |
| 2006/0139592 A1 | 6/2006 | Den Boef et al. | 355/53 |

FOREIGN PATENT DOCUMENTS

| | | |
|---|---|---|
| EP | 1 628 164 A3 | 4/2006 |

* cited by examiner

METHOD AND APPARATUS FOR ANGULAR-RESOLVED SPECTROSCOPIC LITHOGRAPHY CHARACTERIZATION

FIELD

The present invention relates to a method of inspection usable, for example, in the manufacture of devices by a lithographic technique and to a method of manufacturing devices using a lithographic technique.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

In order to determine one or more properties of the substrate, such as the overlay between a resist pattern and an underlying processed pattern, a beam is reflected off the surface of the substrate, for example at an alignment target, and an image is created on, for example, a camera of the reflected beam. By comparing one or more properties of the beam before and after it has been reflected off the substrate, a property of the substrate can be determined. This can be done, for example, by comparing the reflected beam with data stored in a library of known measurements associated with one or more known substrate properties.

SUMMARY

Such a system of illuminating a target and collecting data from the reflected radiation is often used to illuminate a plurality of superimposed patterns, for example a plurality of gratings. The second grating has a predetermined bias compared to the first grating. By analyzing the characteristics of the reflected radiation it is possible to determine the overlay error, OV, between the gratings. This is achieved by introducing a known shift, d, between gratings in different layers. However, the detected overlay accuracy is dependent on both the overlay accuracy itself and asymmetry due to sensor asymmetry resulting from, for example, radiation scattering. A method of reducing the effect of sensor asymmetry includes rotating the substrate but this takes time and may result in a significant loss of throughput. An alternative is to use a reference target but this also may require significant time and space on the substrate since many different targets are required.

It is desirable to, for example, provide an alternative, simple method of reducing the effect of sensor asymmetry.

According to an aspect of the invention, there is provided a method of measuring the overlay error of a substrate, comprising:

projecting a first beam of radiation onto a first target of the substrate, the first target comprising at least two superimposed patterns having a bias of +d between a first of the patterns arranged in or on a first layer and a second of the patterns arranged in or on a second layer, and measuring the asymmetry of that first beam of radiation reflected from the substrate that is indicative of a property of the substrate and generating a first signal indicative of the measured asymmetry;

projecting the first beam of radiation onto a second target of the substrate, the second target comprising at least two superimposed patterns having a bias of −d between a first of the patterns arranged in or on a first layer and a second of the patterns arranged in or on a second layer, and measuring the asymmetry of that first beam of radiation reflected from the substrate that is indicative of a property of the substrate and generating a second signal indicative of the measured asymmetry;

projecting a second beam of radiation onto the first target and measuring the asymmetry of that second beam of radiation reflected from the substrate that is indicative of a property of the substrate and generating a third signal indicative of the measured asymmetry;

projecting the second beam of radiation onto the second target and measuring the asymmetry of that second beam of radiation reflected from the substrate that is indicative of a property of the substrate and generating a fourth signal indicative of the measured asymmetry, wherein the first and second beams have different polarizations, or different wavelengths, or both, and the overlay error is determined on the basis of the first, second, third and fourth signals.

According to a further aspect of the invention there is provided an inspection apparatus configured to measure a property of a substrate, the apparatus comprising:

a radiation projector configured to project radiation onto the substrate;

a detector configured to measure asymmetry of radiation reflected from the substrate; and a processor configured to calculate an overlay error on the basis of the asymmetry, measured by the detector, of radiation of a plurality of wavelengths, or a plurality of polarizations, or both, reflected from the substrate.

According to a further aspect of the invention there is provided a lithographic apparatus, comprising:

an illuminator configured to condition a radiation beam;

a support constructed to hold a patterning device, the patterning device being capable of imparting the radiation beam with a pattern in its cross-section to form a patterned radiation beam;

a substrate table constructed to hold a substrate;

a projection system configured to project the patterned radiation beam onto a target portion of the substrate; and an inspection apparatus configured to measure a property of a substrate, the inspection apparatus comprising:

a radiation projector configured to project radiation onto the substrate;

a detector configured to measure asymmetry of radiation reflected from the substrate; and a processor configured to calculate an overlay error on the basis of the asymmetry, measured by the detector, of radiation of a plurality of wavelengths, or a plurality of polarizations, or both, reflected from the substrate.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1A:
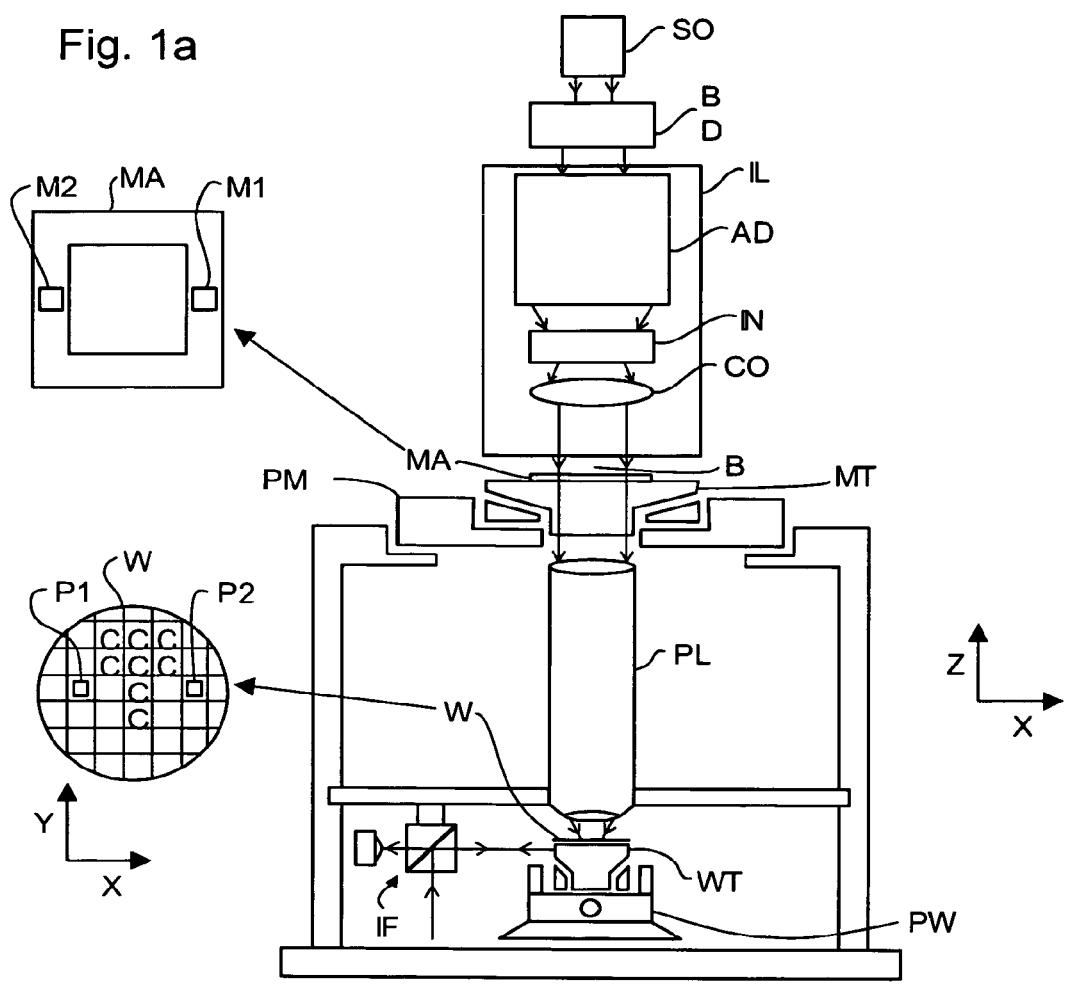
FIG. 1a depicts a lithographic apparatus.

FIG. 1a schematically depicts a lithographic apparatus. The apparatus comprises:

an illumination system (illuminator) IL configured to condition a radiation beam B (e.g. UV radiation or EUV radiation);

a support structure (e.g. a mask table) MT constructed to support a patterning device (e.g. a mask) MA and connected to a first positioner PM configured to accurately position the patterning device in accordance with certain parameters;

a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PL configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam, which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more support structures). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1a, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask) MA, which is held on the support structure (e.g., mask table) MT, and is patterned by the patterning device. Having traversed the patterning device MA, the radiation beam B passes through the projection system PL, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1a) can be used to accurately position the patterning device MA with respect to the path of the radiation beam B, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the support structure MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device MA, the patterning device alignment marks may be located between the dies.

The depicted apparatus could be used in at least one of the following modes:

1. In step mode, the support structure MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the radiation beam is projected onto a target portion C (i.e. a single dynamic exposure). The velocity and direction of the substrate table WT relative to the support structure MT may be determined by the (de-)magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 1B:
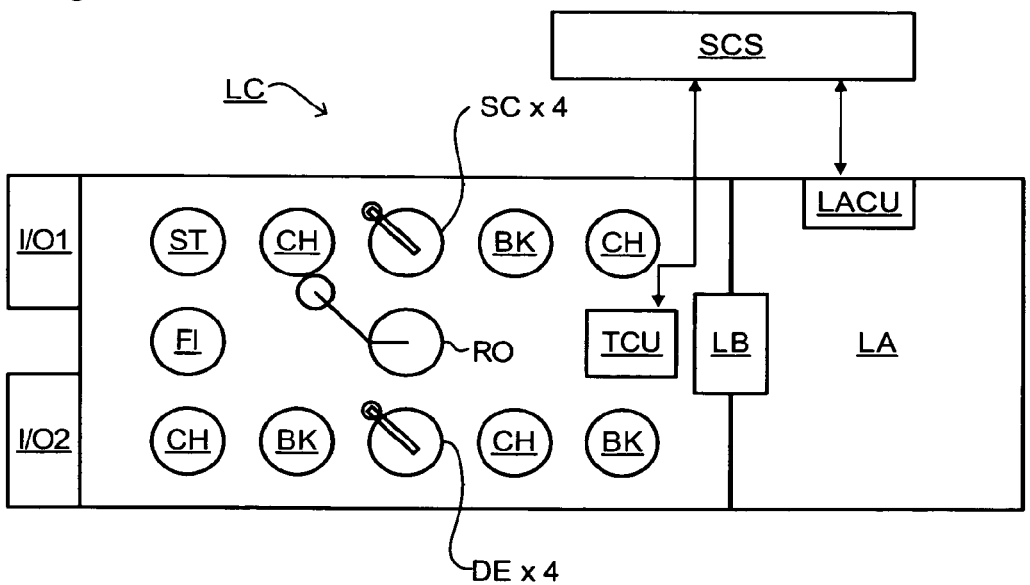
FIG. 1b depicts a lithographic cell or cluster.

As shown in FIG. 1b, the lithographic apparatus LA forms part of a lithographic cell LC, also sometimes referred to a lithocell (lithographic cell) or cluster, which also includes apparatus to perform one or more pre- and post-exposure processes on a substrate. Conventionally these include one or more spin coaters SC to deposit resist layers, one or more developers DE to develop exposed resist, one or more chill plates CH and one or more bake plates BK. A substrate handler, or robot, RO picks up substrates from input/output ports I/O1, I/O2, moves them between the different process devices and delivers then to the loading bay LB of the lithographic apparatus. These devices, which are often collectively referred to as the track, are under the control of a track control unit TCU which is itself controlled by the supervisory control system SCS, which also controls the lithographic apparatus. Thus, the different apparatus can be operated to maximize throughput and processing efficiency.

In order that a substrate that is exposed by the lithographic apparatus is exposed consistently for each layer of resist, there are one or more properties of the substrate that should be measured to determine whether there are changes in alignment, rotation, etc., that must be compensated for by the lithographic apparatus. A separate inspection apparatus is used to determine the one or more properties of the substrate, and in particular, how the one or more properties of different substrates or different layers of the same substrate vary from layer to layer.

Figure 2:
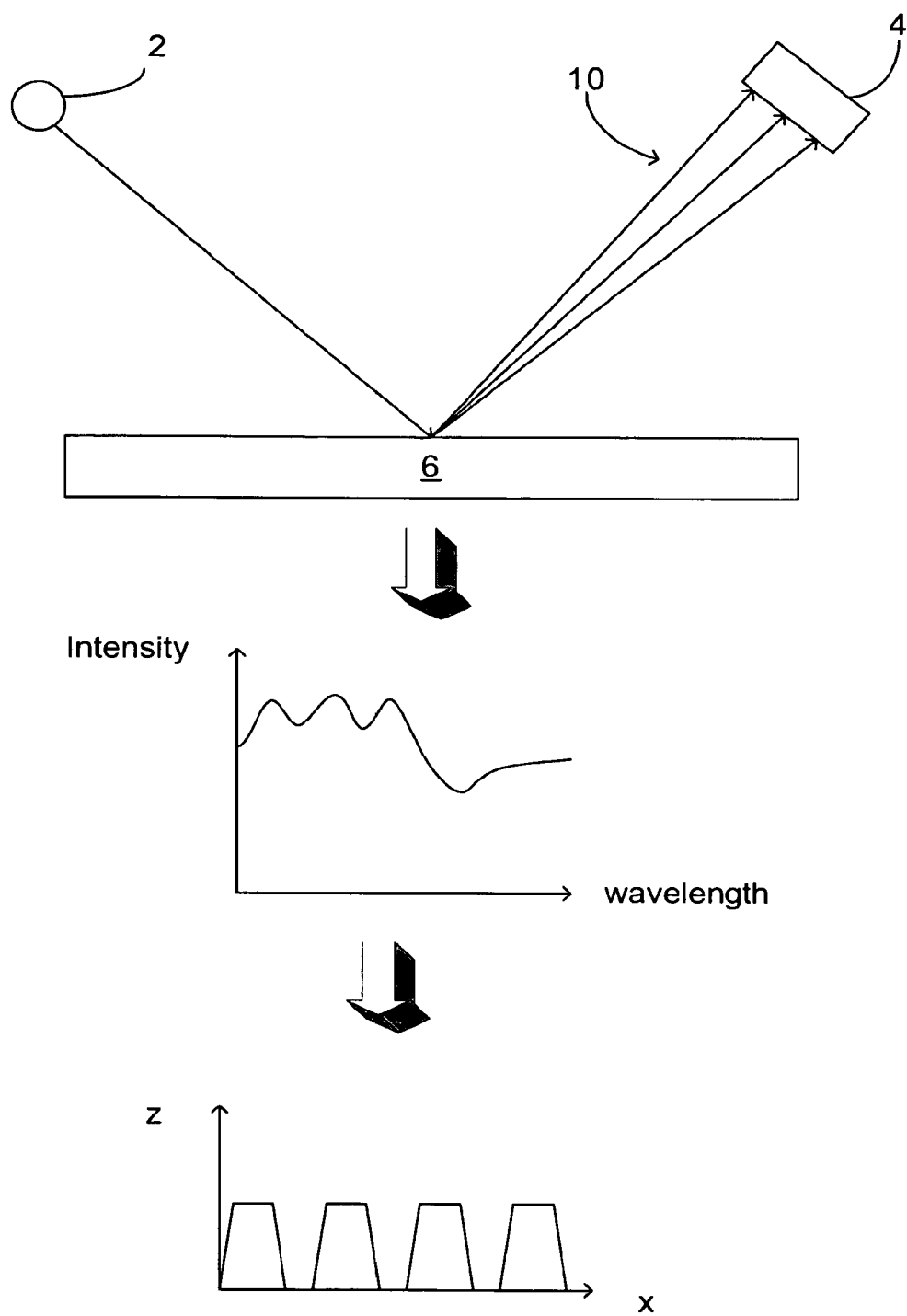
FIG. 2 depicts a scatterometer.

A property of the surface of a substrate W may be determined using a sensor such as a scatterometer such as that depicted in FIG. 2. The scatterometer comprises a broadband (white light) radiation projector 2 which projects radiation onto a substrate W. The reflected radiation is passed to a spectrometer detector 4, which measures a spectrum 10 (intensity as a function of wavelength) of the specular reflected radiation. From this data, the structure or profile giving rise to the detected spectrum may be reconstructed, e.g. by Rigorous Coupled Wave Analysis and non-linear regression or by comparison with a library of simulated spectra as shown at the bottom of FIG. 2. In general, for the reconstruction the general form of the structure is known and some parameters are assumed from knowledge of the process by which the structure was made, leaving only a few parameters of the structure to be determined from the scatterometry data. The radiation source 2 may be part of the scatterometer or may simply be conduit of radiation from an outside radiation generator.

The scatterometer may be a normal-incidence scatterometer or an oblique-incidence scatterometer. Variants of scatterometry may also be used in which the reflection is measured at a range of angles of a single wavelength, rather than the reflection at a single angle of a range of wavelengths.

Figure 3:
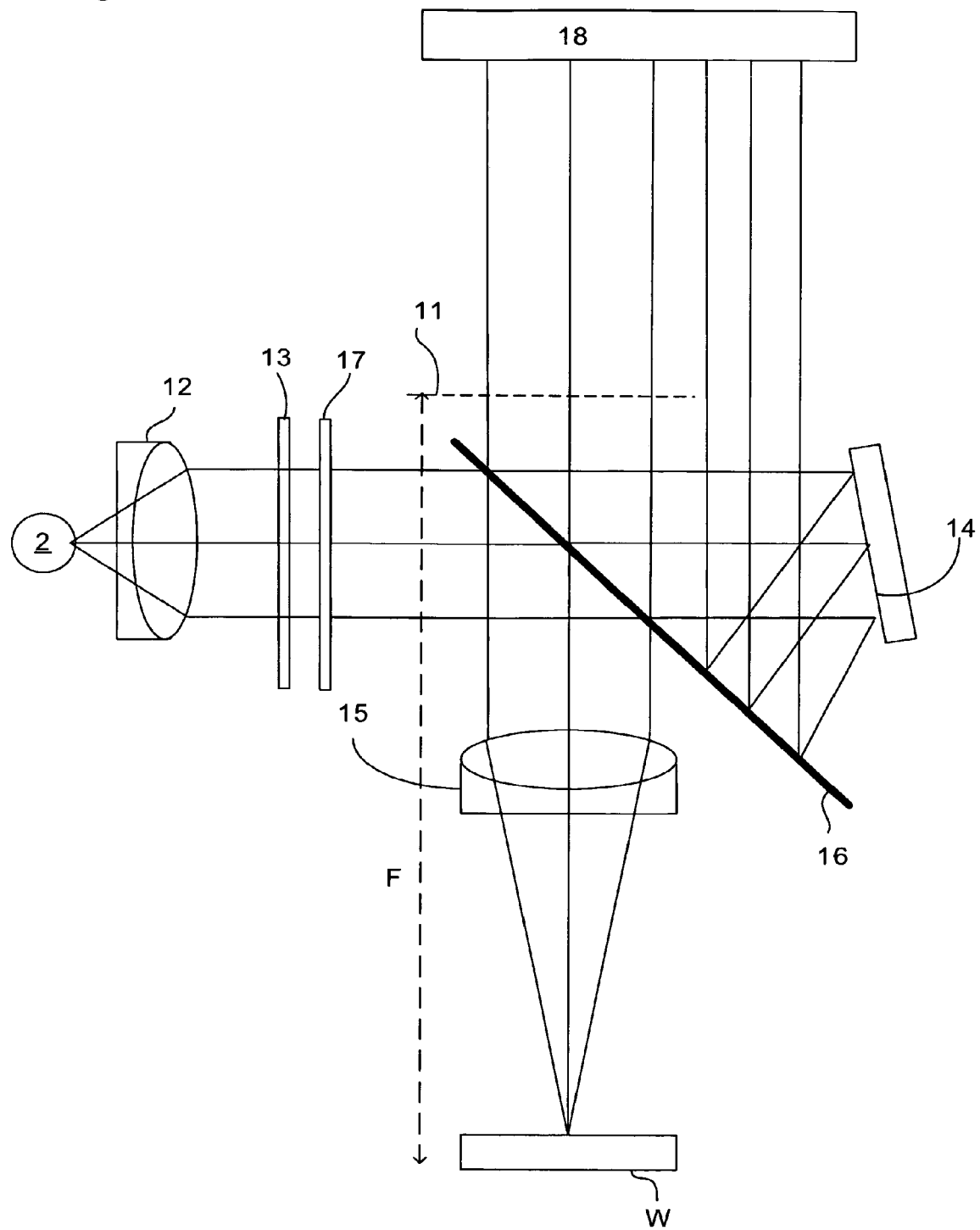
FIG. 3 depicts the general operating principle of measuring an angle resolved spectrum in the pupil plane of a high-NA lens.

A scatterometer configured to measure one or more properties of a substrate may measure, in the pupil plane 11 of a high numerical aperture lens 15, a property of an angle-resolved spectrum reflected from the substrate surface W at a plurality of angles and wavelengths as shown in FIG. 3. Such a scatterometer may comprise a radiation projector 2 to project radiation onto the substrate and a detector 14 configured to detect the reflected spectrum. The pupil plane is the plane in which the radial position of radiation defines the angle of incidence and the angular position defines the azimuth angle of the radiation. The detector 14 is placed in the pupil plane of the high numerical aperture lens 15. The numerical aperture may be high, e.g., in an embodiment, at least 0.9 or at least 0.95. An immersion scatterometer may even have a lens with a numerical aperture over 1.

An angle-resolved scatterometer may measure the intensity of scattered radiation. A scatterometer may also or in addition allow several wavelengths to be measured simultaneously at a range of angles. A property measured by the scatterometer for different wavelengths and angles may be the intensity of transverse magnetic- and transverse electric-polarized radiation and the phase difference between the transverse magnetic- and transverse electric-polarized radiation.

Using a broadband radiation source (i.e. one with a wide range of radiation frequencies or wavelengths—and therefore of colors) is possible, which gives a large etendue, allowing the mixing of multiple wavelengths. The plurality of wavelengths in the broadband preferably each has a bandwidth of, say, *8 and a spacing, therefore, of at least 2*8 (i.e. twice the wavelength). Several "sources" of radiation may be different portions of an extended radiation source which have been split using, e.g., fiber bundles. In this way, angle resolved scatter spectra may be measured at multiple wavelengths in parallel. A 3-D spectrum (wavelength and two different angles) may be measured, which contains more information than a 2-D spectrum. This allows more information to be measured which increases metrology process robustness. This is described in more detail in European patent application publication EP1,628,164A.

A scatterometer that may be used with an embodiment of the present invention is shown in FIG. 3. The radiation of the radiation projector 2 is focused using lens system 12 through interference filter 13 and polarizer 17, reflected by partially reflective surface 16 and is focused onto substrate W via a microscope objective lens 15. The radiation is then transmitted through partially reflective surface 16 onto a CCD detector in the back projected pupil plane 11 in order to have the scatter spectrum detected. The pupil plane 11 is at the focal length of the lens system 15. A detector and high aperture lens are placed at the pupil plane. The pupil plane may be re-imaged with auxiliary optics since the pupil plane of a high-NA lens is usually located inside the lens. The radiation source 2 may be part of the scatterometer or may simply be conduit of radiation from an outside radiation generator.

A reference beam is often used for example to measure the intensity of the incident radiation. When the radiation beam is incident on the partially reflective surface 16 part of it is transmitted through the partially reflective surface towards a reference mirror 14. The reference beam is then projected onto a different part of the same CCD detector 18.

The pupil plane of the reflected radiation is imaged on the CCD detector with an integration time of, for example, 40 milliseconds per frame. In this way, a two-dimensional angular scatter spectrum of a substrate target is imaged on the detector. The detector may be, for example, an array of CCD or CMOS sensors.

A set of interference filters 13 is available to select a wavelength of interest in the range of, say, 405-790 nm or even lower, such as 200-300 nm. The interference filter may be tunable rather than comprising a set of different filters. A grating could be used instead of an interference filter.

The substrate W may comprise a grating which is printed such that after development, the bars are formed of solid resist lines. The bars may alternatively be etched into the substrate.

Figure 6:
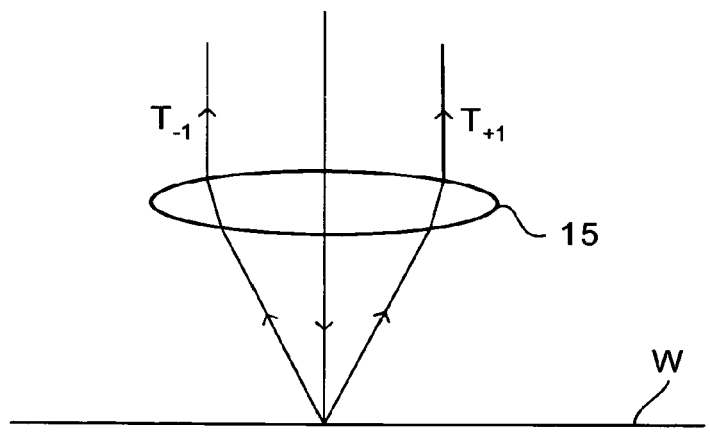
FIG. 6 depicts first and second diffraction orders.

When radiation is reflected by the grating of the substrate W, the transmission of first and second orders, depicted in FIG. 6 are given by:

$$T_{-1} = T_0 - \Delta T$$

$$T_{+1} = T_0 + \Delta T$$

where $T_0$ is the average sensor transmission and $\Delta T$ is the sensor asymmetry.

Imperfections in the optics and scattering due to the debris particles cause asymmetric scattering of the radiation which is not very sensitive to polarization or wavelength. In contrast the asymmetric scattering of radiation due to overlay error is highly sensitive to polarization and wavelength.

To measure the overlay error, OV, between different exposed layers of the substrate, grating patterns, in the respective different layers, having a bias, d, with respect to each other are exposed. The intensities of the $+1^{st}$ and $-1^{st}$ order reflected radiation for small overlay errors can be approximated as:

$$I_{+1} = (T_0 + \Delta T)[B_0 + B_1(OV+d)]$$

$$I_{-1} = (T_0 - \Delta T)[B_0 - B_1(OV+d)]$$

where $B_0$ is the intensity of the first orders without overlay error and $B_1$ is a proportionality factor that describes the sensitivity of the intensity for small overlay errors. $T_0$ and $\Delta T$ are the average sensor transmission and the sensor asymmetry respectively. Further details about this can be found in European patent application publication EP1,628,164. The asymmetry A between the $+1^{st}$ and $-1^{st}$ order intensities is:

$$A_+ = \frac{I_{+1} - I_{-1}}{I_{+1} + I_{-1}}$$
$$= \frac{K(OV+d) + \Delta A}{1 + \Delta A K(OV+d)}$$
$$\cong K(OV+d) + \Delta A$$

where $$K = \frac{B_1}{B_0}$$

$$\Delta A = \frac{\Delta T}{T_0}.$$

As noted, the sensor asymmetry ($\Delta T$) is relatively insensitive to polarization and wavelength. In contrast, the asymmetry resulting from the overlay error is highly sensitive to polarization and wavelength. The factor K is very sensitive to polarization whereas $\Delta A$ is relatively insensitive to polarization. By using the sensitivity to polarization of the various components it is therefore possible to measure the overlay error with a reduced influence of sensor asymmetry.

According to an embodiment of the invention there are two targets, a first with a bias of +d and a second with a bias of −d. In an embodiment, the targets comprise a plurality of gratings but could take any form. Both targets are illuminated with two orthogonal linear polarizations, for example TE and TM radiation. There are therefore four measured asymmetries:

$$A_{1+} = K_1(OV+d) + \Delta A$$

$$A_{1-} = K_1(OV-d) + \Delta A$$

$$A_{2+} = K_2(OV+d) + \Delta A$$

$$A_{2-} = K_2(OV-d) + \Delta A$$

where subscripts 1 and 2 indicate the two polarizations and the + and − subscript indicate the sign of the bias d of the target. These four asymmetries can be used by a processor, comprising, for example, suitable software, to calculate the overlay error OV with reduced influence of the sensor asymmetry:

$$OV = d\frac{(A_{2+} - A_{2-}) - (A_{1+} - A_{1-})}{(A_{2+} + A_{2-}) - (A_{1+} + A_{1-})}$$

This method is most effective when the difference between $K_2$ and $K_1$ is as large as possible because the noise then has a less significant effect. To reduce the effect of noise the overlay error could be measured for a plurality of targets on a substrate. This could be done for the first substrate in a batch of substrates in order to calibrate the apparatus for subsequent exposure of substrates.

Figure 4:
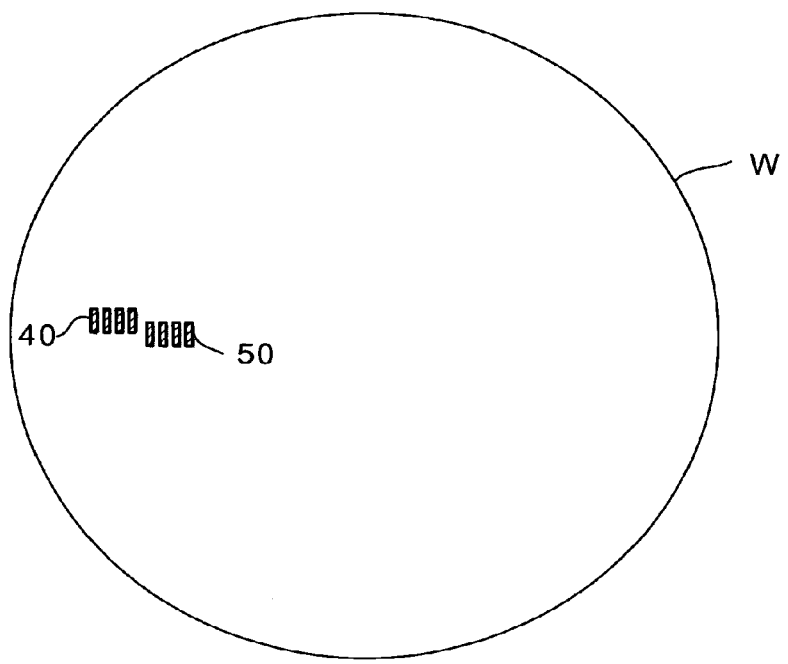
FIG. 4 depicts a substrate used in conjunction with an embodiment of the invention.
Figure 5:
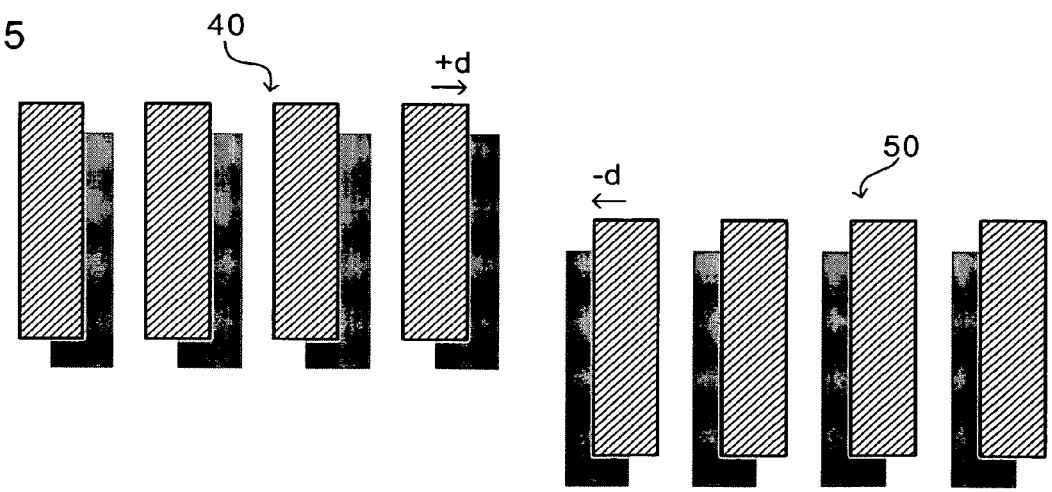
FIG. 5 depicts a detailed view of the substrate depicted in FIG. 4.

According to an embodiment of the invention, there are at least two targets on a substrate, desirably positioned adjacent to each other as shown in FIG. 4. The detailed view in FIG. 5 of the target shown in FIG. 4 shows that the first target 40 has a bias of +d and the second target 50 has a bias of −d. Both of these targets 40, 50 are firstly illuminated using TE radiation and the sensor asymmetry of the $+1^{st}$ and $-1^{st}$ orders for each of the targets calculated, $A_{1+}$, $A_{1-}$. The targets are then illuminated using TM illumination and the sensor asymmetries, $A_{2+}$, $A_{2-}$ calculated.

The following equation is then used to calculate the overlay error:

$$OV = d\frac{(A_{2+} - A_{2-}) - (A_{1+} - A_{1-})}{(A_{2+} + A_{2-}) - (A_{1+} + A_{1-})}$$

Although an embodiment of the invention is described in relation to the $\pm 1^{st}$ diffraction orders, an embodiment of the invention may be applied using higher diffraction orders such as $\pm 2^{nd}$, $\pm 3^{rd}$, $\pm 4^{th}$, etc. diffraction orders.

Although an embodiment of this invention is described relating to two or more different polarizations it could equally well be applied to two or more different wavelengths because the overlay error is sensitive to wavelength whereas the sensor asymmetry is relatively insensitive to wavelength.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. A method of measuring the overlay error of a substrate, comprising:

projecting a first beam of radiation onto a first target of the substrate, the first target comprising at least two superimposed patterns having a bias of +d between a first of the patterns arranged in or on a first layer and a second of the patterns arranged in or on a second layer, and measuring the asymmetry of that first beam of radiation reflected from the substrate that is indicative of a property of the substrate and generating a first signal indicative of the measured asymmetry;

projecting the first beam of radiation onto a second target of the substrate, the second target comprising at least two superimposed patterns having a bias of −d between a first of the patterns arranged in or on a first layer and a second of the patterns arranged in or on a second layer, and measuring the asymmetry of that first beam of radiation reflected from the substrate that is indicative of a property of the substrate and generating a second signal indicative of the measured asymmetry;

projecting a second beam of radiation onto the first target and measuring the asymmetry of that second beam of radiation reflected from the substrate that is indicative of a property of the substrate and generating a third signal indicative of the measured asymmetry;

projecting the second beam of radiation onto the second target and measuring the asymmetry of that second beam of radiation reflected from the substrate that is indicative of a property of the substrate and generating a fourth signal indicative of the measured asymmetry, wherein the first and second beams have different polarizations, or different wavelengths, or both, and the overlay error is determined on the basis of the first, second, third and fourth signals.

2. The method of claim 1, wherein A1+ the first signal, A1− is the second signal, A2+ is the third signal and A2− is the fourth signal, the overlay error OV being given by:

$$OV = d\frac{(A_{2+} - A_{2-}) - (A_{1+} - A_{1-})}{(A_{2+} + A_{2-}) - (A_{1+} + A_{1-})}.$$

3. The method of claim 1, wherein the first and second beams are two substantially orthogonally linearly polarized beams.

4. The method of claim 1, wherein the first and second targets are adjacent to each other on the substrate.

5. The method of claim 1, wherein the first and second targets form a pair of targets, the substrate comprising a plurality of pairs of targets, each target of the pair having an equal and opposite bias to the other target of the pair and each pair located at a different position on the substrate, the method of claim 1 being repeated for each pair of targets to determine the overlay error at a plurality of different positions on the substrate.

6. The method of claim 1, wherein the first and second targets each comprise a plurality of gratings.

7. The method of claim 6, wherein the first target comprises two gratings having a bias +d with respect to each other and the second target comprises two gratings having a bias −d with respect to each other.

8. The method of claim 1, wherein the first and second beams have substantially different wavelengths.

9. A method of manufacturing a substrate comprising projecting a patterned beam of radiation onto the substrate to expose the substrate wherein the exposing is based on overlay error determined by a method, comprising:

projecting a first beam of radiation onto a first target of the substrate, the first target comprising at least two superimposed patterns having a bias of +d between a first of the patterns arranged in or on a first layer and a second of the patterns arranged in or 6n a second layer, and measuring the asymmetry of that first beam of radiation reflected from the substrate that is indicative of a property of the substrate and generating a first signal indicative of the measured asymmetry;

projecting the first beam of radiation onto a second target of the substrate, the second target comprising at least two superimposed patterns having a bias of −d between a first of the patterns arranged in or on a first layer and a second of the patterns arranged in or on a second layer, and measuring the asymmetry of that first beam of radiation reflected from the substrate that is indicative of a property of the substrate and generating a second signal indicative of the measured asymmetry;

projecting a second beam of radiation onto the first target and measuring the asymmetry of that second beam of radiation reflected from the substrate that is indicative of a property of the substrate and generating a third signal indicative of the measured asymmetry;

projecting the second beam of radiation onto the second target and measuring the asymmetry of that second beam of radiation reflected from the substrate that is indicative of a property of the substrate and generating a fourth signal indicative of the measured asymmetry, wherein the first and second beams have different polarizations, or different wavelengths, or both, and the overlay error is determined on the basis of the first, second, third and fourth signals.

10. An inspection apparatus configured to measure a property of a substrate, the apparatus comprising:

a radiation projector configured to project radiation onto the substrate;

a detector configured to measure asymmetry of radiation reflected from the substrate; and a processor configured to calculate an overlay error on the basis of the asymmetry, measured by the detector, of radiation of a plurality of wavelengths, or a plurality of polarizations, or both, reflected from the substrate;

wherein the detector is configured to:

measure the asymmetry of a first beam of radiation of first polarization, wavelength, or both, reflected from a first target of the substrate, the first target comprising at least two superimposed patterns having a bias of +d between a first of the patterns arranged in or on a first layer and a second of the patterns arranged in or on a second layer, and generate a first signal, measure the asymmetry of the first beam of radiation reflected from a second target of the substrate, the second target comprising at least two superimposed patterns having a bias of −d between a first of the patterns arranged in or on a first layer and a second of the patterns arranged in or on a second layer, and generate a second signal, measure asymmetry of a second beam of radiation of a second polarization, wavelength, or both, different from that of the first beam, reflected from the first target and generate a third signal, and measure asymmetry of the second beam of radiation reflected from the second target and generate a fourth signal, and wherein the processor is configured to determine the overlay error on the basis of the first, second, third and fourth signals.

11. The inspection apparatus of claim 10, wherein the radiation projector comprises a radiation source configured to supply the radiation at a plurality of wavelengths, or at a plurality of polarizations, or both, onto the substrate.

12. The inspection apparatus of claim 10, wherein A1+ is the first signal, A1− is the second signal, A2+ is the third signal and A2− is the fourth signal, and the processor is configured to determine the overlay error OV by:

$$OV = d\frac{(A_{2+} - A_{2-}) - (A_{1+} - A_{1-})}{(A_{2+} + A_{2-}) - (A_{1+} + A_{1-})}.$$

13. The inspection apparatus of claim 10, wherein the first and second beams are two substantially orthogonally linearly polarized beams.

14. The inspection apparatus of claim 10, wherein the first and second beams have substantially different wavelengths.

15. The inspection apparatus of claim 10, wherein the first and second targets are adjacent to each other on the substrate.

16. The inspection apparatus of claim 10, wherein the first and second targets each comprise a plurality of gratings.

17. The inspection apparatus of claim 16, wherein the first target comprises two gratings having a bias +d with respect to each other and the second target comprises two gratings having a bias −d with respect to each other.

18. The inspection apparatus of claim 10, configured to determine the overlay error at a plurality of different positions on the substrate by using a plurality of pairs of targets of the substrate, each pair of targets comprising the first and second targets and located at a different position on the substrate and each target of the pair having an equal and opposite bias to the other target of the pair.

19. A lithographic apparatus, comprising:

an illuminator configured to condition a radiation beam;

a support constructed to hold a patterning device, the patterning device being capable of imparting the radiation beam with a pattern in its cross-section to form a patterned radiation beam;

a substrate table constructed to hold a substrate;

a projection system configured to project the patterned radiation beam onto a target portion of the substrate; and an inspection apparatus configured to measure a property of a substrate, the inspection apparatus comprising:

a radiation projector configured to project radiation onto the substrate;

a detector configured to measure asymmetry of radiation reflected from the substrate; and a processor configured to calculate an overlay error on the basis of the asymmetry, measured by the detector, of radiation of a plurality of wavelengths, or a plurality of polarizations, or both, reflected from the substrate.

* * * * *

UNITED STATES PATENT AND TRADEMARK OFFICE
CERTIFICATE OF CORRECTION

PATENT NO. : 7,564,555 B2
APPLICATION NO. : 11/504106
DATED : July 21, 2009
INVENTOR(S) : Den Boef et al.

It is certified that error appears in the above-identified patent and that said Letters Patent is hereby corrected as shown below:

Column 11, In Claim 9, line 39, delete "6n" and insert --on--.

Signed and Sealed this

Twenty-third Day of February, 2010

David J. Kappos
*Director of the United States Patent and Trademark Office*